(12) United States Patent
Kamata et al.

(10) Patent No.: US 8,623,587 B2
(45) Date of Patent: Jan. 7, 2014

(54) RESIDUE REMOVING LIQUID COMPOSITION AND METHOD FOR CLEANING SEMICONDUCTOR ELEMENT USING SAME

(75) Inventors: Kyoko Kamata, Tokyo (JP); Keiichi Tanaka, Tokyo (JP); Hiroshi Matsunaga, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 144 days.

(21) Appl. No.: 13/057,338

(22) PCT Filed: Jul. 7, 2009

(86) PCT No.: PCT/JP2009/062335
§ 371 (c)(1),
(2), (4) Date: May 27, 2011

(87) PCT Pub. No.: WO2010/016350
PCT Pub. Date: Feb. 11, 2010

(65) Prior Publication Data
US 2011/0256483 A1    Oct. 20, 2011

(30) Foreign Application Priority Data

Aug. 5, 2008    (JP) ................................ 2008-201886

(51) Int. Cl.
*G03F 7/26* (2006.01)
(52) U.S. Cl.
USPC ............................ 430/316; 430/311; 430/329
(58) Field of Classification Search
USPC .......................................... 430/311, 316, 329
See application file for complete search history.

(56) References Cited

U.S. PATENT DOCUMENTS

| 5,997,754 A * | 12/1999 | Yamaha et al. .................. 216/17 |
| 2006/0094221 A1 * | 5/2006 | Soda et al. .................... 438/597 |
| 2006/0205623 A1 | 9/2006 | Oowada et al. |
| 2007/0096331 A1 * | 5/2007 | Nagahara et al. ............. 257/774 |

OTHER PUBLICATIONS

International Search Report Issued Oct. 20, 2009 in PCT/JP09/062335 filed Jul. 7, 2009.

* cited by examiner

*Primary Examiner* — Kathleen Duda
(74) *Attorney, Agent, or Firm* — Oblon, Spivak, McClelland, Maier & Neustadt, L.L.P.

(57) ABSTRACT

Provided are a residue removing liquid composition capable of completely removing a resist residue and a titanium (Ti)-derived residue that remains after dry etching and ashing in via hole formation in a production process for a semiconductor substrate having metal wiring of aluminum (Al) or an Al alloy, at a low temperature in a short time, not corroding parts of an interlayer insulating material, a wiring material and others, and a cleaning method for semiconductor devices using it.

The residue removing liquid composition contains (A) ammonium fluoride, (B) methanesulfonic acid, (C) a carbon-carbon triple bond-having compound, (D) a water-soluble organic solvent, and (E) water, wherein the content of (A), (C), (D) and (E) in the residue removing liquid composition is from 0.005 to 2% by mass, from 0.1 to 10% by mass, from 60 to 75% by mass and from 5 to 38% by mass, respectively, and (B) is contained in an amount of from 0.9 to 1.5 times (by mol) the amount of (A).

13 Claims, 2 Drawing Sheets

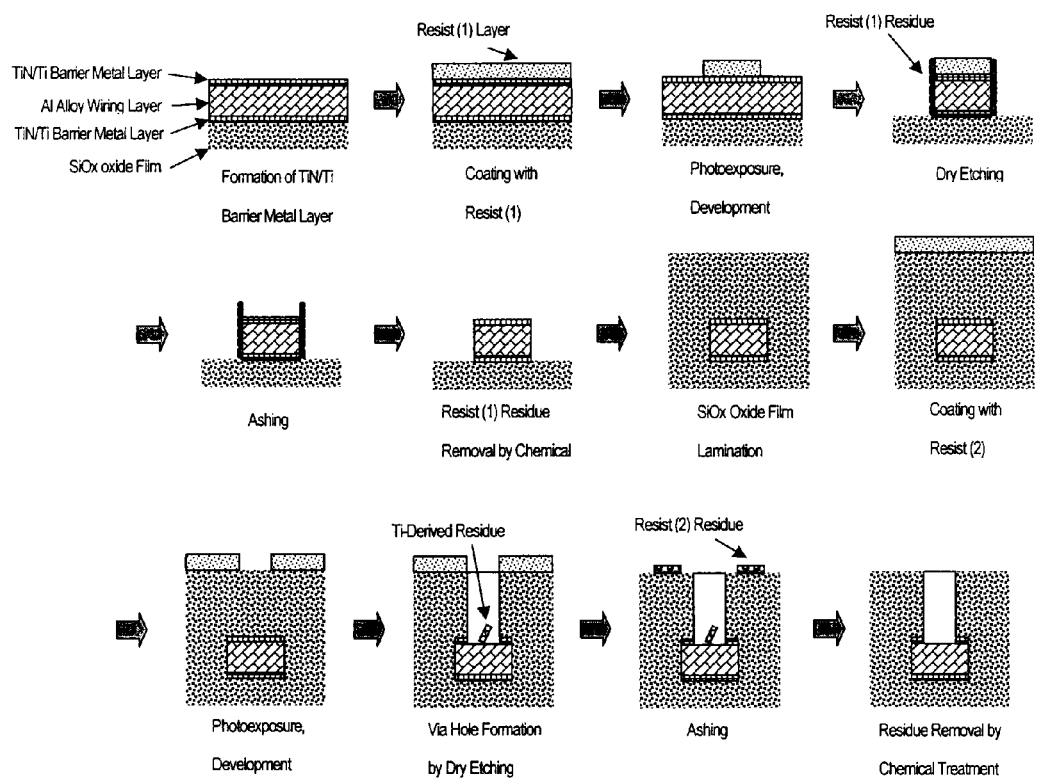
Fig. 1 - Process Chart of Aluminium Alloy Circuit Production

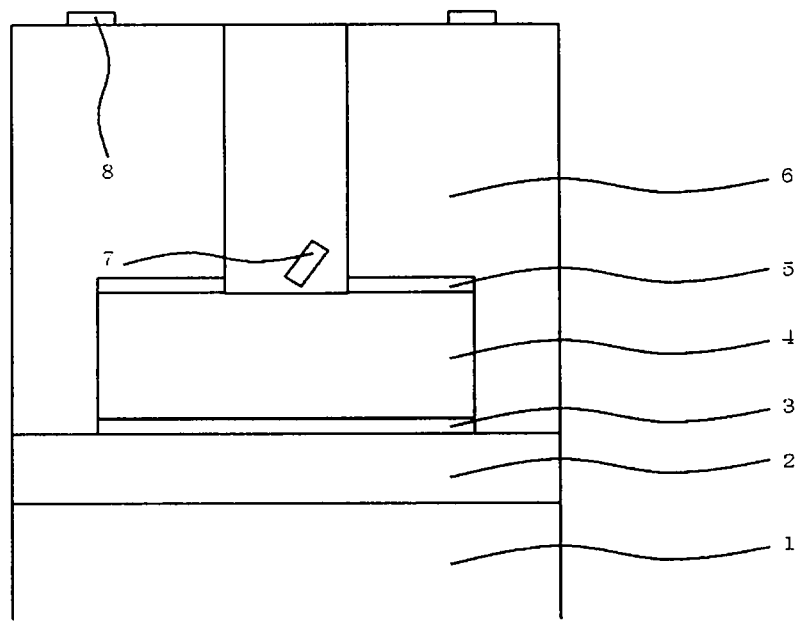

RESIDUE REMOVING LIQUID COMPOSITION AND METHOD FOR CLEANING SEMICONDUCTOR ELEMENT USING SAME

TECHNICAL FIELD

The present invention relates to a residue removing liquid composition for use in a wiring process for semiconductor devices or liquid-crystal panel devices such as IC, LSI and the like, and further relates to a method of using it for removing a resist residue or a wiring material-derived residue. More precisely, the present invention relates to a composition favorable for use for removing a resist residue or a wiring material-derived metal residue that remains after dry etching and ashing for via hole formation in a production process for a semiconductor substrate having metal wiring of aluminium (Al) or an Al alloy containing at least 90% by mass of Al, as well as to a cleaning method for removing a resist residue or a wiring material-derived residue by the use of the residue removing liquid composition.

BACKGROUND ART

In a production process for semiconductor devices such as IC, LSI or the like, lithography technology is applied to the formation of wiring and to the formation of via holes in an insulating interlayer. Briefly, a resist is uniformly applied onto a conductive metal film of Al, cupper (Cu), Al alloy or the like or an insulating film of silicon oxide (SiOx) film or the like formed on a substrate, and patterned through photoexposure and development, and via the resist serving as a mask, the conductive metal film or the insulating film is dry-etched and then the unnecessary resist and the resist residue denatured through dry etching are removed to attain wiring formation or via hole formation in the insulating interlayer. After dry etching, often employed is a method of removing the unnecessary resist by plasma etching. Around the pattern thus formed by such dry etching followed by ashing, there remains a resist residue (protective deposition film) or a metal residue derived from a plasma gas-denatured interlayer insulating material or wiring material (hereinafter these may be collectively referred to as residues).

When such residues remain, they may be a cause of disconnection and may bring about various troubles, and therefore, it is desired to completely remove them. For removing the remaining residues, there is employed cleaning treatment with a cleaning agent (residue removing liquid composition).

In dry etching and ashing for via hole formation in a production process for a semiconductor substrate having Al alloy wiring with a titanium (Ti)-based alloy serving as a barrier metal, the resist residue is a residue derived from the resist that remains on the surface of the substrate after dry etching and ashing, and the metal residue derived from the wiring material denatured by plasma gas is an oxidation product of a metal component, Al, Cu or Ti, especially Ti among them remaining on the side wall and the bottom of a via hole (hereinafter referred to as titanium (Ti)-derived residue).

Heretofore, for completely removing the resist residue or the Ti-derived residue, used is a chemical liquid, and for example, there is proposed a residue removing liquid composition comprising "a mixed liquid of an alkanolamine and a water-soluble organic solvent" (for example, see Patent References 1 and 2). The removing liquid can function only at a high temperature taking a long time, and is therefore used in a batch cleaning apparatus. Recently, however, for efficiently cleaning a large variety of devices, the cleaning method is being changed from a batch mode method to a sheet-fed mode method suitable for manufacturing of a wide variety of products in small quantities. The sheet-fed mode cleaning apparatus requires low-temperature short-time treatment, in which, therefore, the above-mentioned organic amine-based removing liquid could not be used. Accordingly, in sheet-fed cleaning treatment, the resist residue and the Ti-derived residue must be removed at a low temperature in a short time.

As a residue removing liquid composition applicable to low-temperature short-time treatment, a lot of patent applications have heretofore been filed relating to a fluorine compound-containing liquid. For example, as a residue removing liquid composition having the advantage of usability of pure water as a rinsing liquid, there is proposed "a composition comprising a fluorine compound, a water-soluble organic solvent and an anticorrosive" (for example, see Patent References 3 and 4). Recently, however, a large quantity of Ti-derived residues have become formed along with advanced micropatterning in wiring, and the composition containing a fluorine compound and a water-soluble organic solvent could not remove resist residues or Ti-derived residues. In addition, the composition containing a fluorine compound and a water-soluble organic solvent has the property that, when diluted with water, its etching rate to Al alloy increases; and in case where substitution of the chemical liquid with water could not be attained rapidly for some reasons in the process of chemical liquid treatment-rinsing with pure water, the liquid diluted with water to be more corrosive to Al alloy may be kept in contact with the substrate to corrode the Al alloy wiring part. This is another drawback of the composition.

For enhancing the resist residue and Ti-derived residue removability, there has been created a method of adding an acidic additive to the fluorine compound-containing composition. Patent Reference 5 proposes "a fluorine compound-containing liquid comprising a fluorine compound and a sulfonic acid"; however, the chemical liquid could not exhibit sufficient anticorrosive performance for interlayer insulating films and via hole bottoms (see Comparative Example 34).

Patent Reference 6 proposes "an acidic aqueous solution containing an organic phosphonic acid and a fluorine compound"; however, the chemical liquid could not sufficiently remove residues and could not exhibit sufficient anticorrosive performance for via hole bottoms (see Comparative Example 35).

Patent Reference 7 proposes "a fluorine compound and orthoboric acid or orthophosphoric acid and a water-soluble organic solvent"; however, the chemical liquid could not sufficiently remove residues (see Comparative Example 36).

A water-soluble organic solvent is often added for anticorrosion to the composition prepared by adding an acidic compound to the fluorine compound-containing composition; however, the resulting composition has a drawback in that, like the composition containing a fluorine compound and a water-soluble organic solvent, its etching rate to Al alloy increases when diluted with water and, as a result, the composition corrodes the Al alloy wiring part.

Patent Reference 8 proposes "a semiconductor substrate cleaning liquid containing acetylene alcohol for removing metal contamination and containing a fluorine compound and a water-soluble or water-miscible organic solvent"; however, this has no description relating to the effect of the added acetylene alcohol for anticorrosion to metal wiring.

Patent Reference 9 proposes "a cleaning agent for semiconductor device production, which comprises an aqueous solution containing acetylene alcohol for increasing the deposited polymer removing speed, and containing a fluorine compound, boric acid and a water-soluble organic solvent";

and Patent Reference 10 proposes "a cleaning liquid for semiconductor device production, which comprises an aqueous solution containing acetylene alcohol for increasing the deposited polymer removing speed, and containing an organic carboxylic acid ammonium salt and/or an organic carboxylic acid amine salt, a fluorine compound, a water-soluble or water-miscible organic solvent, and an inorganic acid and/or an organic acid". However, these have no description relating to the effect of the added acetylene alcohol for anticorrosion to metal wiring.

Patent Reference 11 proposes "a composition containing at least one of an acetylene alcohol compound and an organic sulfonic acid compound, and at least one of a polyalcohol and its derivative, and further containing at least one of a fluorine compound and a quaternary ammonium hydroxide salt", in which, however, the composition is proposed for production of semiconductor circuit devices having metal wiring of mainly Cu as the wiring material. However, in Patent Reference 11, the samples were evaluated in point of wiring with tantalum as a barrier metal, and there is given no description relating to Ti-derived residues. In this, in addition, there is also given no description relating to a chemical liquid containing both a fluorine compound and an organic sulfonic acid. In addition, the residue removability of the chemical liquid was not sufficient (see Comparative Examples 37 to 39).

In addition, patent application have been filed relating to a residue removing liquid composition that comprises a fluorine compound-containing liquid and an additive added thereto. However, a residue removing liquid composition having corrosion resistance to interlayer insulating film materials, wiring materials and others and having good removability of resist residues and Ti-derived residues is not as yet developed, and it is desired to develop such a residue removing liquid composition.

[Patent Reference 1] JP-A 62-49355
[Patent Reference 2] JP-A 64-42653
[Patent Reference 3] JP-A 7-201794
[Patent Reference 4] JP-A 8-202052
[Patent Reference 5] JP-A 2006-66533
[Patent Reference 6] JP-A 2006-191002
[Patent Reference 7] JP-A 11-67703
[Patent Reference 8] JP-A 2000-208467
[Patent Reference 9] JP-A 11-323394
[Patent Reference 10] JP-A 10-55993
[Patent Reference 11] JP-A 2006-251491

BRIEF DESCRIPTION OF THE DRAWINGS

FIG. 1 It is a process chart of aluminium alloy circuit production in which the residue removing liquid composition of the present invention is favorably used.

FIG. 2 It is a substrate after via hole dry etching and ashing.

DESCRIPTION OF REFERENCE NUMERALS

1. Silicon Substrate
2. SiOx Oxide Film
3. TiN/Ti Barrier Metal Layer
4. Al Alloy Wiring Layer
5. TiN/Ti Barrier Metal Layer
6. SiOx Oxide Film
7. Ti-Derived Residue
8. Resist Residue

DISCLOSURE OF THE INVENTION

Problems that the Invention is to Solve

An object of the present invention is to provide a residue removing liquid composition capable of completely removing a resist residue and a titanium (Ti)-derived residue that remains after dry etching and ashing in via hole formation in a production process for a semiconductor substrate having metal wiring of aluminium (Al) or an Al alloy, at a low temperature in a short time, not corroding parts of an interlayer insulating material, a wiring material and others, and to provide a cleaning method for semiconductor devices using it.

Means for Solving the Problems

The present inventors have assiduously studied for the purpose of solving the above-mentioned problems and, as a result, have found that, when a carbon-carbon triple bond-having compound is added as an anticorrosive for Al alloy wiring that contains Al in an amount of at least 90% by mass, to a removing agent that comprises ammonium fluoride and, as an acidic compound, methanesulfonic acid, then an anticorrosive effect of the undiluted liquid or of the liquid diluted with water for Al alloy may be imparted thereto and that the resulting composition can be prevented from corroding interlayer insulating materials and wiring materials while having the residue removability thereof.

Specifically, the present invention relates to a cleaning method for semiconductor devices, and its summary includes the following:

1. A residue removing liquid composition containing (A) ammonium fluoride, (B) methanesulfonic acid, (C) at least one carbon-carbon triple bond-having compound selected from 3-methyl-1-pentyn-3-ol, 1-ethynyl-1-cyclohexanol, 2-propyn-1-ol, 2-butyne-1,4-diol, 4-ethyl-1-octyn-3-ol, 3-methyl-1-butyn-3-ol, 1-octyn-3-ol, ethynylbenzene, 3,3-dimethyl-1-butyne, 2-butyn-1-ol, 3,5-dimethyl-1-hexyn-3-ol and 3-hexyne-2,5-diol, (D) at least one water-soluble organic solvent selected from polyalcohols, glycol ethers and amides, and (E) water, wherein the content of (A), (C), (D) and (E) in the residue removing liquid composition is from 0.005 to 2% by mass, from 0.1 to 10% by mass, from 60 to 75% by mass and from 5 to 38% by mass, respectively, and (B) is contained in an amount of from 0.9 to 1.5 times (by mol) the amount of (A).

2. A cleaning method for removing residues remaining in an electronic material substrate produced by laminating SiOx, a barrier metal layer of TiN/Ti, an Al alloy layer of Al—Cu, Al—Si or Al—Si—Cu containing at least 90% by mass of Al, and a barrier metal layer of TiN/Ti in that order on a silicon substrate, applying a resist (1) thereto to form a resist (1) layer, then exposing it to light and developing it, dry-etching it via the resist (1) layer serving as a mask to form an Al alloy wiring pattern, removing the resist (1) layer by ashing with plasma gas, removing the resist (1) residue by chemical treatment, further laminating thereon an interlayer insulating film layer of SiOx, thereafter applying a resist (2) thereto to form a resist (2) layer, then exposing it to light and developing it, dry-etching it via the resist (2) layer serving as a mask to form a via hole in the interlayer insulating film layer and the barrier metal layer on the Al alloy wiring pattern, and further removing the resist (2) layer by ashing with plasma gas; wherein the residue removing liquid composition of the above 1 is used for removing the residue in at least the via hole.

Advantage of the Invention

Using the residue removing liquid composition and the cleaning method of the present invention, the resist residue and the Ti-derived residue remaining after dry etching and ashing for via hole formation in a production process for a semiconductor substrate having metal wiring of Al or an Al alloy containing at least 90% by mass of Al can be completely removed at a low temperature in a short time, and not corroding the parts of an interlayer insulating material, a wiring material and others, the product yield can be increased in production of semiconductor devices.

BEST MODE FOR CARRYING OUT THE INVENTION

[Residue Removing Liquid Composition]

The residue removing liquid composition of the present invention contains (A) ammonium fluoride, (B) methanesulfonic acid, (C) a carbon-carbon triple bond-having compound, (D) at least one water-soluble organic solvent selected from polyalcohols, glycol ethers and amides, and (E) water, and the content of (A), (C), (D) and (E) in the residue removing liquid composition is from 0.005 to 2% by mass, from 0.1 to 10% by mass, from 60 to 75% by mass and from 5 to 38% by mass, respectively, and (B) is contained in an amount of from 0.9 to 1.5 times (by mol) the amount of (A).

<<(A) Ammonium Fluoride>>

The residue removing liquid composition of the present invention contains (A) ammonium fluoride. The content of ammonium fluoride in the residue removing liquid composition is within a concentration range of from 0.005 to 2.0% by mass, preferably from 0.01 to 1.8% by mass, more preferably from 0.1 to 1.5% by mass. When the concentration of ammonium fluoride is more than 2.0% by mass, then the corrosiveness of the composition to materials may be high; but when less than 0.005% by mass, the residue removing speed may be low.

<<(B) Methanesulfonic Acid>>

The residue removing liquid composition of the present invention contains (B) methanesulfonic acid. Methanesulfonic acid has a small acid dissociation constant (pKa) in water or in a water-soluble organic solvent, and is employed in the residue removing liquid composition of the present invention further in consideration of the balance between the miscibility, the stability and the residue removability thereof when mixed in the residue removing liquid composition and the material corrosiveness thereof.

Methanesulfonic acid must be in an amount of from 0.9 times to 1.5 times by mol the amount of ammonium fluoride contained in the composition, but preferably from 0.9 times to 1.4 times, more preferably from 0.95 times to 1.3 times. When the amount is less than 0.9 times, then the residue removability may be insufficient or the interlayer insulating material corrosiveness increases. When more than 1.5 times, then the residue removability may be insufficient or the metal wiring material corrosiveness may increase.

<<(C) Carbon-Carbon Triple Bond-Having Compound>>

The residue removing liquid composition of the present invention contains (C) a carbon-carbon triple bond-having compound. In the present invention, the carbon-carbon triple bond-having compound (C) is at least one selected from 3-methyl-1-pentyn-3-ol, 1-ethynyl-1-cyclohexanol, 2-propyn-1-ol, 2-butyne-1,4-diol, 4-ethyl-1-octyn-3-ol, 3-methyl-1-butyn-3-ol, 1-octyn-3-ol, ethynylbenzene, 3,3-dimethyl-1-butyne, 2-butyn-1-ol, 3,5-dimethyl-1-hexyn-3-ol and 3-hexyne-2,5-diol; and the composition may contain a plurality of the above-mentioned compounds.

The content of the carbon-carbon triple bond-having compound in the residue removing liquid composition must be from 0.1% by mass to 10% by mass, but is preferably from 0.15% by mass to 8% by mass, more preferably from 0.2% by mass to 5% by mass. When the content is less than 0.1% by mass, the anticorrosive effect of the residue removing liquid composition or the composition diluted with water for Al alloy with at least 90% by mass of Al may be insufficient; but when more than 10% by mass, the residue removability and the compound miscibility may lower.

<<(D) Water-Soluble Organic Solvent>>

The water-soluble organic solvent (D) for use in the present invention is at least one selected from polyalcohols, glycol ethers and amides. Using the organic solvent enhances the residue removability of the composition.

Preferably, the polyalcohols include ethylene glycol, diethylene glycol, polyethylene glycol, propylene glycol, dipropylene glycol, polypropylene glycol, glycerin, diglycerin, polyglycerin, 1,3-butylene glycol, etc.

Preferably, the glycol ethers include ethylene glycol monomethyl ether, ethylene glycol monoethyl ether, ethylene glycol monobutyl ether, ethylene glycol monophenyl ether, diethylene glycol monomethyl ether, diethylene glycol monoethyl ether, diethylene glycol monobutyl ether, diethylene glycol dimethyl ether, propylene glycol monomethyl ether, propylene glycol monobutyl ether, ethylene glycol monomethyl ether acetate, triethylene glycol monomethyl ether, triethylene glycol monoethyl ether, triethylene glycol monobutyl ether, triethylene glycol dimethyl ether, dipropylene glycol monopropyl ether, tripropylene glycol dimethyl ether, etc.

Preferably, the amides include dimethylformamide, dimethylacetamide, acetamide, methylacetamide, ethylacetamide, formamide, methylformamide, dimethylformamide, ethylformamide, diethylformamide, etc.

In the present invention, the water-soluble organic solvent (D) may be combined with any other organic solvent. Preferably, the other organic solvent includes lactones such as γ-butyrolactone; sulfoxides such as diethyl sulfoxide, diphenyl sulfoxide, etc.; nitriles such as acetonitrile, benzonitrile, etc.; alcohols such as methanol, ethanol, isopropanol, ethylene glycol, etc.; esters such as methyl acetate, ethyl acetate, etc. In the present invention, one or more of the above-mentioned organic solvents may be used either singly or as combined.

The content of the water-soluble organic solvent in the residue removing liquid composition must be from 60 to 75% by mass, but is preferably from 65 to 75% by mass. When the content of the water-soluble organic solvent is less than 60% by mass, then the material corrosion may increase; but when more than 75% by mass, the residue removability may lower.

<<(E) Water>>

The residue removing liquid composition of the present invention contains (E) water. The water content in the residue removing liquid composition must be from 5 to 38% by mass, but is preferably from 20 to 38% by mass, more preferably from 20 to 31% by mass.

When the water content is less than 5% by mass, then the residue removability may lower; but when more than 38% by mass, the material corrosion may increase.

[Cleaning Method]

The cleaning method of the present invention is for removing residues remaining in an electronic material substrate produced by laminating SiOx, a barrier metal layer of TiN/Ti, an Al alloy layer of Al—Cu, Al—Si or Al—Si—Cu containing at least 90% by mass of Al, and a barrier metal layer of TiN/Ti in that order on a silicon substrate, applying a resist (1) thereto to form a resist (1) layer, then exposing it to light and developing it, dry-etching it via the resist (1) layer serving as a mask to form an Al alloy wiring pattern, removing the resist (1) layer by ashing with plasma gas, removing the resist (1) residue by chemical treatment, further laminating thereon an interlayer insulating film layer of SiOx, thereafter applying a resist (2) thereto to form a resist (2) layer, then exposing it to light and developing it, dry-etching it via the resist (2) layer serving as a mask to form a via hole in the interlayer insulating film layer and the barrier metal layer on the Al alloy wiring pattern, and further removing the resist (2) layer by ashing with plasma gas; wherein the residue removing liquid composition of the present invention is used for removing the residue in at least the via hole.

FIG. 1 is a process chart of aluminium alloy circuit production in which the residue removing liquid composition of the present invention is favorably used. In the cleaning method of the present invention, the residue removing liquid composition of the present invention is used for removing the resist residue that remains after dry-etching an interlayer insulating film layer or a barrier metal layer via a resist serving as a mask on a substrate for via hole formation followed by ashing with plasma in semiconductor device production or removing the Ti-derived residue that remains in the via hole. In this, the Ti-derived residue is the residue derived from Ti contained in the TiN/Ti barrier metal layer, as shown in FIG. 1, in the third line, the second view from the right, "Ashing". As in FIG. 1, the residue removing liquid composition of the present invention removes the resist residue existing on the surface of the SiOx oxide film together with the Ti-derived residue in the via hole.

Al or Al alloy wiring to be processed according to the cleaning method of the present invention is formed of Al or an Al alloy containing at least 90% by mass of Al, and the alloy includes Al—Cu, Al—Si, Al—Si—Cu, etc. The Al content of the Al alloy is preferably at least 95% by mass, more preferably at least 98% by mass.

The barrier metal layer is a layer to be laminated on the wiring layer for the purpose of enhancing the wiring reliability, and TiN/Ti is a material widely used for Al alloy wiring. The cleaning method of the present invention is applicable with no limitation to any and every TiN/Ti barrier metal layer generally used for Al alloy wiring, for removal of the Ti-derived residue that is derived from the TiN/Ti.

The temperature in residue removal is preferably from 0° C. to 50° C., more preferably from 10° C. to 40° C., even more preferably from 15° C. to 35° C.

The processing time for residue removal is preferably from 10 seconds to 5 minutes, more preferably from 30 seconds to 3 minutes.

Regarding the rinsing liquid to be used after the treatment with the residue removing liquid composition in the cleaning method of the present invention, rinsing with pure water alone may be good with no problem; however, a water-soluble organic solvent such as methyl alcohol, ethyl alcohol, isopropanol, dimethylacetamide, dimethylsulfoxide, glycol ether, ethanolamine or the like may also be used. In addition, a mixture of the above-mentioned water-soluble organic solvent and pure water may be used as the rinsing liquid.

EXAMPLES

The present invention is described in more detail with reference to the following Examples and Comparative Examples; however, the invention is not restricted at all by these Examples.

<<Evaluation of Cleaned Condition>>

After cleaned in Examples and Comparative Examples, the samples were checked with a scanning electronic microscope (SEM) for the Ti-derived residue and resist residue removing condition and for the corrosiveness of the interlayer insulating film material and the via hole bottom material, and were evaluated according to the following standards. For scanning electromicroscopy, used was a high-resolution field-emission scanning electronic microscope, Hitachi's S-4700.

<Standards for Determination of Ti-Derived Residue and Resist Residue Removability>
○: Good.
Δ: Some residue remained.
x: Not removed at all.

<Standards for Determination of Interlayer Insulating Film Layer Material Corrosiveness>
○: Good.
x: Corroded and deformed.

<Standards for Determination of Via Hole Bottom Material Corrosiveness>
○: Good.
x: Corroded and deformed.

Cleaning Method:

FIG. 2 shows a cross-sectional view of an Al alloy circuit device containing at least 90% by mass of aluminium (Al) to be cleaned. As in FIG. 2, an underlayer oxide film 2 of silicon oxide (SiOx) or the like is formed on a silicon substrate 1, then a barrier metal layer 3 of titanium nitride (TiN)/titanium (Ti) is formed, and, as wiring, an Al alloy layer 4 of Al-copper (Cu), Al-silicon (Si) or Al—Si—Cu (this may be referred to as Al alloy wiring) is formed thereon, a barrier metal layer 5 of TiN/Ti is laminated, thereafter a resist (1) is applied to it to form a resist (1) layer, then this is exposed to light and developed, and then dry-etched via the resist (1) layer serving as a mask to form an Al alloy wiring pattern, and further the resist (1) layer is removed by ashing with plasma gas, and the resist (1) residue is removed by chemical treatment. Further an interlayer insulating film layer 6 of SiOx is formed on it, and thereafter a resist (2) is applied thereto to form a resist (2) layer, and then this is exposed to light and developed, and dry-etched via the resist (2) layer serving as a mask to form a via hole in the interlayer insulating film layer 6 and the barrier metal layer 5, and further the resist (2) layer is removed by ashing with oxygen plasma gas. At the bottom of the via hole, the Al alloy layer is exposed out; and the Ti-derived residue 7 remains on the side wall of the via hole and the resist (2) residue 8 on the top of the interlayer insulating film layer 6. The aluminium alloy circuit device (sample wafer for evaluation) was cleaned with the residue removing liquid composition mentioned below.

Example 1, Comparative Examples 1 to 9, and 16 to 24

According to the formulation (% by mass) shown in Table 1, residue removing liquid compositions of Example 1, Comparative Examples 1 to 9 and 16 to 24 were prepared. The residue removing liquid composition of Example 1 contained ammonium fluoride, while those of Comparative Examples 1 to 5 and 16 to 20 contained hydrofluoric acid as the fluorine compound in place of ammonium fluoride and those of Comparative Examples 6 to 8 and 21 to 23 contained tetramethylammonium fluoride. The compositions of Comparative Examples 9 and 24 did not contain a fluorine compound. The residue removing liquid compositions of Example 1 and Comparative Examples 1 to 9 contained 3-methyl-1-pentyn-3-ol as the carbon-carbon triple bond-having compound (anticorrosive) in an amount of 2.00% by mass, but those of Comparative Examples 16 to 24 did not contain the anticorrosive. The reagents used here are all special grade chemical reagents.

The sample wafer for evaluation shown in FIG. 1 was dipped in the residue removing liquid composition of Example 1, Comparative Examples 1 to 9 and 16 to 24 at 25° C. for 2 minutes, then rinsed with ultrapure water, and dried with a blow of nitrogen gas. After thus treated, the samples were checked through scanning electromicroscopy (SEM) for the removability of the titanium-derived residue 7 and the resist residue 8 and for the material corrosiveness of the interlayer insulating film layer 6 and the via hole bottom. The results are shown in Table 1.

Using the resist removing liquid composition of Example 1, the Ti-derived residue and the resist residue were removed with no material corrosion, and the result was good. The removing liquid compositions containing hydrofluoric acid of Comparative Examples 1 to 5 and 16 to 20 were unsatisfactory in point of the residue removability and the via hole bottom material anticorrosiveness. The removing liquid compositions containing tetramethylammonium fluoride of Comparative Examples 6 to 8 and 21 to 23 were unsatisfactory in point of the residue removability and/or the material anticorrosiveness. The removing liquid compositions not containing a fluorine compound of Comparative Examples 9 and 24 were unsatisfactory in point of the residue removability.

Example 2, Comparative Examples 10 to 12 and 25 to 27

According to Table 1, residue removing liquid compositions of Example 2 and Comparative Examples 10 to 12 and 25 to 27 were prepared. The molar ratio of methanesulfonic acid/fluorine compound was 1.00 in the residue removing liquid composition of Example 2; 0.75 in Comparative Examples 10 and 25; 1.69 in Comparative Examples 11 and 26; and 2.42 in Comparative Examples 12 and 27. The residue removing liquid compositions of Example 2 and Comparative Examples 10 to 12 contained ethynylbenzene as the carbon-carbon triple bond-having compound (anticorrosive) in an amount of 0.50% by mass, but those of Comparative Examples 25 to 27 did not contain the anticorrosive. The reagents used here are all special grade chemical reagents. The others were the same as in Example 1, and the results are shown in Table 1.

Using the resist removing liquid composition of Example 2 in which methanesulfonic acid/fluorine compound (molar ratio)=1.00, the Ti-derived residue and the resist residue were removed with no material corrosion, and the result was good. The residue removing liquid compositions where methanesulfonic acid/fluorine compound (molar ratio)=0.75 of Comparative Examples 10 and 25 corroded the interlayer insulating film. The residue removing liquid compositions where methanesulfonic acid/fluorine compound (molar ratio)=1.69 of Comparative Examples 11 and 26, and the residue removing liquid compositions where methanesulfonic acid/fluorine compound (molar ratio)=2.42 of Comparative Examples 12 and 27 were unsatisfactory in point of the resist residue removability and corroded the via hole bottom material.

Examples 3 to 9, Comparative Examples 13 and 28

According to Table 1, residue removing liquid compositions of Examples 3 to 9 and Comparative Examples 13 and 28 were prepared. The residue removing liquid compositions of Examples 3 to 9 contained a water-soluble organic solvent selected from polyalcohols, glycol ethers and amides, but the residue removing liquid compositions of Comparative Examples 13 and 28 did not contain a predetermined amount of the water-soluble organic solvent. The compositions of Examples 3 to 7 and Comparative Example 13 contained 3,5-dimethyl-1-hexyn-3-ol as the carbon-carbon triple bond-having compound (anticorrosive) in an amount of 0.30% by mass, while the compositions of Examples 8 and 9 contained 3-methyl-1-pentyn-3-ol as the anticorrosive in an amount of 0.20% by mass, but the composition of Comparative Example 28 did not contain the anticorrosive. The reagents used here are all special grade chemical reagents. The others were the same as in Example 1, and the results are shown in Table 1.

The resist removing liquid compositions of Examples 3 to 9 removed the Ti-derived residue and the resist residue and did not corrode the material; however, the resist removing liquid compositions of Comparative Examples 13 and 28 did not satisfactorily remove the Ti-derived residue and the resist residue.

Comparative Examples 14 to 15, 29 to 30

According to Table 1, residue removing liquid compositions of Comparative Examples 14 to 15 and 29 to 30 were prepared. The residue removing liquid compositions of Comparative Examples 14 and 29 contained a water-soluble organic solvent in an amount of 76.75% by mass, and those of Comparative Examples 15 and 30 contained a water-soluble organic solvent in an amount of 56.75% by mass. The residue removing liquid compositions of Comparative Examples 14 to 15 contained 3-methyl-1-pentyn-3-ol as the carbon-carbon triple bond-having compound (anticorrosive) in an amount of 2.00% by mass, while those of Comparative Examples 29 to 30 did not contain the anticorrosive. The reagents used here are all special grade chemical reagents. The others were the same as in Example 1, and the results are shown in Table 1.

The resist removing liquid compositions of Comparative Examples 14 and 29 were unsatisfactory in point of the Ti-derived residue removability and the resist residue removability. The resist removing liquid compositions of Comparative Examples 15 and 30 corroded the material. On the other hand, the residue removing liquid composition of Example 1 containing the water-soluble organic solvent in the range of from 60 to 75% by mass as defined in the present invention (66.75% by mass), and the residue removing liquid composition of Example 9 (72.94% by mass) removed the Ti-derived residue and the resist residue with no material corrosion, and the results were good.

Examples 10 to 13, Comparative Examples 31 to 33

According to Table 1, residue removing liquid compositions of Examples 10 to 13 and Comparative Examples 31 to 33 were prepared. Excluding the carbon-carbon triple bond-having compound (anticorrosive), the basic formulation of the removing liquid composition comprises 0.80% by mass of ammonium fluoride, 2.20% by mass of methanesulfonic acid, 20% by mass of diethylene glycol and 51% by mass of propylene glycol monomethyl ether with the balance of water. The residue removing liquid composition of Comparative Example 31 did not contain the anticorrosive, and the residue removing liquid compositions of Comparative Examples 32 and 33 contained an additive except the carbon-carbon triple bond-having compound as in the present invention, in an amount of 1.00% by mass added thereto. The reagents used here are all special grade chemical reagents. The others were the same as in Example 1, and the results are shown in Table 1.

The resist removing liquid compositions of Examples 10 to 13 removed the Ti-derived residue and the resist residue with no material corrosion, and the results were good. The residue removing liquid compositions of Comparative Examples 31 to 33 corroded the via hole bottom.

Examples 14 to 25

According to Table 1, a residue removing liquid composition of Example 14 was prepared. Excluding the carbon-carbon triple bond-having compound (anticorrosive), the basic formulation of the removing liquid composition comprises 1.00% by mass of ammonium fluoride, 3.00% by mass of methanesulfonic acid, 30% by mass of diethylene glycol and 35% by mass of propylene glycol monomethyl ether with the balance of water, in which the molar ratio of methanesulfonic acid/fluorine compound was 1.16. The residue removing liquid compositions of Examples 15 to 25 have the same formulation as that of Example 14, in which, however, the carbon-carbon triple bond-having compound (anticorrosive) were changed.

The reagents used here are all special grade chemical reagents. The others were the same as in Example 1, and the results are shown in Table 1.

The resist removing liquid compositions of Examples 14 to 25 removed the Ti-derived residue and the resist residue with no material corrosion, and the results were good.

Comparative Examples 34 to 39

According to Table 1, residue removing liquid compositions of Comparative Examples 34 to 39 were prepared. The residue removing liquid composition of Comparative Example 34 is outside the scope of the present invention in point of the molar ratio of methanesulfonic acid/ammonium fluoride therein, and does not contain the carbon-carbon triple bond-having compound (anticorrosive); that of Comparative Example 35 does not contain ammonium fluoride, methanesulfonic acid and anticorrosive; that of Comparative Example 36 does not contain methanesulfonic acid and anticorrosive; that of Comparative Example 37 does not contain ammonium fluoride and methanesulfonic acid; that of Comparative Example 38 does not contain ammonium fluoride and anticorrosive; and that of Comparative Example 39 does not contain methanesulfonic acid, in which the amount of the water-soluble organic solvent is excessive. The reagents used here are all special grade chemical reagents. The others were the same as in Example 1, and the results are shown in Table 1.

The resist removing liquid composition of Comparative Example 34 was unsatisfactory in point of the material anticorrosiveness; that of Comparative Example 35 was unsatisfactory in point of the removability and corroded the via hole bottom; and those of Comparative Examples 36 to 39 were unsatisfactory in point of the removability.

TABLE 1

| | Formation of Removing Liquid Composition (% by mass) | | | | | | |
|---|---|---|---|---|---|---|---|
| | Ammonium Fluoride (Fluorine Compound) | | Methanesulfonic Acid (Acid) | | Molar Ratio *1 | Carbon-Carbon Tripe Bond-Having Compound (Anticorrosive) | |
| Example 1 | Ammonium Fluoride | 0.90 | Methanesulfonic Acid | 2.35 | 1.01 | 3-Methyl-pentyn-3-ol | 2.00 |
| Example 2 | Ammonium Fluoride | 0.70 | Methanesulfonic Acid | 1.82 | 1.00 | Ethynylbenzene | 0.50 |
| Example 3 | Ammonium Fluoride | 0.90 | Methanesulfonic Acid | 2.35 | 1.01 | 3,5-Dimethyl-1-hexyl-3-ol | 0.30 |
| Example 4 | Ammonium Fluoride | 0.90 | Methanesulfonic Acid | 2.35 | 1.01 | 3,5-Dimethyl-1-hexyl-3-ol | 0.30 |
| Example 5 | Ammonium Fluoride | 0.90 | Methanesulfonic Acid | 2.35 | 1.01 | 3,5-Dimethyl-1-hexyl-3-ol | 0.30 |
| Example 6 | Ammonium Fluoride | 0.90 | Methanesulfonic Acid | 2.35 | 1.01 | 3,5-Dimethyl-1-hexyl-3-ol | 0.30 |
| Example 7 | Ammonium Fluoride | 0.90 | Methanesulfonic Acid | 2.35 | 1.01 | 3,5-Dimethyl-1-hexyl-3-ol | 0.30 |
| Example 8 | Ammonium Fluoride | 0.50 | Methanesulfonic Acid | 1.56 | 1.20 | 3-Methyl-1-pentyn-3-ol | 0.20 |
| Example 9 | Ammonium Fluoride | 0.50 | Methanesulfonic Acid | 1.56 | 1.20 | 3-Methyl-1-pentyn-3-ol | 0.20 |
| Example 10 | Ammonium Fluoride | 0.80 | Methanesulfonic Acid | 2.20 | 1.06 | 3-Methyl-1-pentyn-3-ol | 1.00 |
| Example 11 | Ammonium Fluoride | 0.80 | Methanesulfonic Acid | 2.20 | 1.06 | 2-Propyne-1-ol | 1.00 |
| Example 12 | Ammonium Fluoride | 0.80 | Methanesulfonic Acid | 2.20 | 1.06 | 2-Butyn-1,4-diol | 1.00 |
| Example 13 | Ammonium Fluoride | 0.80 | Methanesulfonic Acid | 2.20 | 1.06 | 4-Ethyl-1-octyn-3-ol | 1.00 |
| Example 14 | Ammonium Fluoride | 1.00 | Methanesulfonic Acid | 3.00 | 1.16 | 3-Methyl-pentyn-3-ol | 0.50 |
| Example 15 | Ammonium Fluoride | 1.00 | Methanesulfonic Acid | 3.00 | 1.16 | 1-Ethynyl-1-cyclohexanol | 0.50 |
| Example 16 | Ammonium Fluoride | 1.00 | Methanesulfonic Acid | 3.00 | 1.16 | 2-Propyn-1-ol | 0.50 |
| Example 17 | Ammonium Fluoride | 1.00 | Methanesulfonic Acid | 3.00 | 1.16 | 2-Butyne-1,4-diol | 0.50 |
| Example 18 | Ammonium Fluoride | 1.00 | Methanesulfonic Acid | 3.00 | 1.16 | 4-Ethyl-1-octyn-3-ol | 0.50 |
| Example 19 | Ammonium Fluoride | 1.00 | Methanesulfonic Acid | 3.00 | 1.16 | 3-Methyl-1-butyn-3-ol | 0.50 |
| Example 20 | Ammonium Fluoride | 1.00 | Methanesulfonic Acid | 3.00 | 1.16 | 1-Octyn-3-ol | 0.50 |
| Example 21 | Ammonium Fluoride | 1.00 | Methanesulfonic Acid | 3.00 | 1.16 | Ethynylbenzene | 0.50 |
| Example 22 | Ammonium Fluoride | 1.00 | Methanesulfonic Acid | 3.00 | 1.16 | 3,3-Dimethyl-1-butyne | 0.50 |
| Example 23 | Ammonium Fluoride | 1.00 | Methanesulfonic Acid | 3.00 | 1.16 | 2-Butyn-1-ol | 0.50 |
| Example 24 | Ammonium Fluoride | 1.00 | Methanesulfonic Acid | 3.00 | 1.16 | 3,5-Dimethyl-1-hexyn-3-ol | 0.50 |
| Example 25 | Ammonium Fluoride | 1.00 | Methanesulfonic Acid | 3.00 | 1.16 | 3-Hexyne-2,5-diol | 0.50 |
| Comparative Example 1 | Hydrofluoric Acid | 0.45 | — | — | 0.00 | 3-Methyl-pentyn-3-ol | 2.00 |
| Comparative Example 2 | Hydrofluoric Acid | 0.45 | Methanesulfonic Acid | 0.50 | 0.23 | 3-Methyl-pentyn-3-ol | 2.00 |
| Comparative Example 3 | Hydrofluoric Acid | 0.45 | Methanesulfonic Acid | 1.00 | 0.46 | 3-Methyl-pentyn-3-ol | 2.00 |
| Comparative Example 4 | Hydrofluoric Acid | 0.45 | Methanesulfonic Acid | 2.00 | 0.93 | 3-Methyl-pentyn-3-ol | 2.00 |
| Comparative Example 5 | Hydrofluoric Acid | 0.45 | Methanesulfonic Acid | 3.00 | 1.39 | 3-Methyl-pentyn-3-ol | 2.00 |
| Comparative Example 6 | Tetramethylammonium Fluoride | 2.00 | Methanesulfonic Acid | 1.00 | 0.48 | 3-Methyl-pentyn-3-ol | 2.00 |
| Comparative Example 7 | Tetramethylammonium Fluoride | 2.00 | Methanesulfonic Acid | 2.30 | 1.11 | 3-Methyl-pentyn-3-ol | 2.00 |
| Comparative Example 8 | Tetramethylammonium Fluoride | 2.00 | Methanesulfonic Acid | 4.00 | 1.94 | 3-Methyl-pentyn-3-ol | 2.00 |
| Comparative Example 9 | — | — | Methanesulfonic Acid | 2.00 | — | 3-Methyl-pentyn-3-ol | 2.00 |
| Comparative Example 10 | Ammonium Fluoride | 0.70 | Methanesulfonic Acid | 1.36 | 0.75 | Ethynylbenzene | 0.50 |
| Comparative Example 11 | Ammonium Fluoride | 0.80 | Methanesulfonic Acid | 3.50 | 1.69 | Ethynylbenzene | 0.50 |
| Comparative Example 12 | Ammonium Fluoride | 0.80 | Methanesulfonic Acid | 5.00 | 2.42 | Ethynylbenzene | 0.50 |

TABLE 1-continued

| | | | | | | |
|---|---|---|---|---|---|---|
| Comparative Example 13 | Ammonium Fluoride | 0.90 | Methanesulfonic Acid | 2.35 | 1.01 | 3,5-Dimethyl-1-hexyn-3-ol | 0.30 |
| Comparative Example 14 | Ammonium Fluoride | 0.90 | Methanesulfonic Acid | 2.35 | 1.01 | 3-Methyl-pentyn-3-ol | 2.00 |
| Comparative Example 15 | Ammonium Fluoride | 0.90 | Methanesulfonic Acid | 2.35 | 1.01 | 3-Methyl-pentyn-3-ol | 2.00 |
| Comparative Example 16 | Hydrofluoric Acid | 0.45 | — | — | 0.00 | — | — |
| Comparative Example 17 | Hydrofluoric Acid | 0.45 | Methanesulfonic Acid | 0.50 | 0.23 | — | — |
| Comparative Example 18 | Hydrofluoric Acid | 0.45 | Methanesulfonic Acid | 1.00 | 0.46 | — | — |
| Comparative Example 19 | Hydrofluoric Acid | 0.45 | Methanesulfonic Acid | 2.00 | 0.93 | — | — |
| Comparative Example 20 | Hydrofluoric Acid | 0.45 | Methanesulfonic Acid | 3.00 | 1.39 | — | — |
| Comparative Example 21 | Tetramethylammonium Fluoride | 2.00 | Methanesulfonic Acid | 1.00 | 0.48 | — | — |
| Comparative Example 22 | Tetramethylammonium Fluoride | 2.00 | Methanesulfonic Acid | 2.30 | 1.11 | — | — |
| Comparative Example 23 | Tatramethylammonium Fluoride | 2.00 | Methanesulfonic Acid | 4.00 | 1.94 | — | — |
| Comparative Example 24 | — | — | Methanesulfonic Acid | 2.00 | — | — | — |
| Comparative Example 25 | Ammonium Fluoride | 0.70 | Methanesulfonic Acid | 1.36 | 0.75 | — | — |
| Comparative Example 26 | Ammonium Fluoride | 0.80 | Methanesulfonic Acid | 3.50 | 1.69 | — | — |
| Comparative Example 27 | Ammonium Fluoride | 0.80 | Methanesulfonic Acid | 5.00 | 2.42 | — | — |
| Comparative Example 28 | Ammonium Fluoride | 0.90 | Methanesulfonic Acid | 2.35 | 1.01 | — | — |
| Comparative Example 29 | Ammonium Fluoride | 0.90 | Methanesulfonic Acid | 2.35 | 1.01 | — | — |
| Comparative Example 30 | Ammonium Fluoride | 0.90 | Methanesulfonic Acid | 2.35 | 1.01 | — | — |
| Comparative Example 31 | Ammonium Fluoride | 0.80 | Methanesulfonic Acid | 2.20 | 1.06 | — | — |
| Comparative Example 32 | Ammonium Fluoride | 0.80 | Methanesulfonic Acid | 2.20 | 1.06 | 2,5-Dimethyl-3-hexyn-2,5-diol | 1.00 |
| Comparative Example 33 | Ammonium Fluoride | 0.80 | Methanesulfonic Acid | 2.20 | 1.06 | Benzyl Alcohol | 1.00 |
| Comparative Example 34 | Ammonium Fluoride | 1.00 | Methanesulfonic Acid | 1.00 | 0.39 | — | — |
| Comparative Example 35 | Ammonium Silicofluoride | 0.02 | HEDP | 0.10 | — | — | — |
| Comparative Example 36 | Ammonium Fluoride | 1.00 | Orthoboric Acid | 3.00 | — | — | — |
| Comparative Example 37 | — | — | — | — | — | 2-Butyne-1,4-diol | 1.00 |
| Comparative Example 38 | — | — | Methanesulfonic Acid | 10.00 | — | — | — |
| Comparative Example 39 | Ammonium Fluoride | 0.02 | — | — | — | 2-Butyne-1,4-diol | 4.95 |

| | Formation of Removing Liquid Composition (% by mass) | | | | Evaluation | | | |
|---|---|---|---|---|---|---|---|---|
| | | | | | Removability | | Corrosiveness | |
| | Water-Soluble Organic Solvent | | | Water | Ti-Derived Residue | Resist Residue | Interlayer Insulating Film | Via Hole Bottom |
| Example 1 | DMAc | 36.75 | DEG | 30.00 | 28.00 | ○ | ○ | ○ | ○ |
| Example 2 | DMAc | 37.48 | DEG | 30.00 | 29.50 | ○ | ○ | ○ | ○ |
| Example 3 | DMAc | 36.75 | DPG | 30.00 | 29.70 | ○ | ○ | ○ | ○ |
| Example 4 | DMAc | 36.75 | TEG | 30.00 | 29.70 | ○ | ○ | ○ | ○ |
| Example 5 | DMAc | 36.75 | DGME | 30.00 | 29.70 | ○ | ○ | ○ | ○ |
| Example 6 | DMAc | 36.75 | MFDG | 30.00 | 29.70 | ○ | ○ | ○ | ○ |
| Example 7 | DMAc | 46.75 | DGBE | 20.00 | 29.70 | ○ | ○ | ○ | ○ |
| Example 8 | DEG | 67.94 | — | — | 28.00 | ○ | ○ | ○ | ○ |
| Example 9 | DEG | 72.94 | — | — | 23.00 | ○ | ○ | ○ | ○ |
| Example 10 | DEG | 20.00 | MFG | 51.00 | 25.00 | ○ | ○ | ○ | ○ |
| Example 11 | DEG | 20.00 | MFG | 51.00 | 25.00 | ○ | ○ | ○ | ○ |
| Example 12 | DEG | 20.00 | MFG | 51.00 | 25.00 | ○ | ○ | ○ | ○ |
| Example 13 | DEG | 20.00 | MFG | 51.00 | 25.00 | ○ | ○ | ○ | ○ |
| Example 14 | DEG | 30.00 | MFG | 35.00 | 30.50 | ○ | ○ | ○ | ○ |
| Example 15 | DEG | 30.00 | MFG | 35.00 | 30.50 | ○ | ○ | ○ | ○ |
| Example 16 | DEG | 30.00 | MFG | 35.00 | 30.50 | ○ | ○ | ○ | ○ |
| Example 17 | DEG | 30.00 | MFG | 35.00 | 30.50 | ○ | ○ | ○ | ○ |
| Example 18 | DEG | 30.00 | MFG | 35.00 | 30.50 | ○ | ○ | ○ | ○ |
| Example 19 | DEG | 30.00 | MFG | 35.00 | 30.50 | ○ | ○ | ○ | ○ |
| Example 20 | DEG | 30.00 | MFG | 35.00 | 30.50 | ○ | ○ | ○ | ○ |
| Example 21 | DEG | 30.00 | MFG | 35.00 | 30.50 | ○ | ○ | ○ | ○ |
| Example 22 | DEG | 30.00 | MFG | 35.00 | 30.50 | ○ | ○ | ○ | ○ |
| Example 23 | DEG | 30.00 | MFG | 35.00 | 30.50 | ○ | ○ | ○ | ○ |
| Example 24 | DEG | 30.00 | MFG | 35.00 | 30.50 | ○ | ○ | ○ | ○ |
| Example 25 | DEG | 30.00 | MFG | 35.00 | 30.50 | ○ | ○ | ○ | ○ |
| Comparative Example 1 | DMAc | 39.55 | DEG | 30.00 | 28.00 | △ | △ | ○ | x |
| Comparative Example 2 | DMAc | 39.05 | DEG | 30.00 | 28.00 | △ | △ | ○ | x |
| Comparative Example 3 | DMAc | 38.55 | DEG | 30.00 | 28.00 | △ | △ | ○ | x |
| Comparative Example 4 | DMAc | 37.55 | DEG | 30.00 | 28.00 | △ | △ | ○ | x |
| Comparative Example 5 | DMAc | 36.55 | DEG | 30.00 | 28.00 | △ | △ | ○ | x |
| Comparative Example 6 | DMAc | 37.00 | DEG | 30.00 | 28.00 | x | ○ | x | x |
| Comparative Example 7 | DMAc | 35.70 | DEG | 30.00 | 28.00 | △ | ○ | ○ | x |
| Comparative Example 8 | DMAc | 34.00 | DEG | 30.00 | 28.00 | △ | △ | ○ | x |
| Comparative Example 9 | DMAc | 38.00 | DEG | 30.00 | 28.00 | x | x | ○ | ○ |
| Comparative Example 10 | DMAc | 37.94 | DEG | 30.00 | 29.50 | ○ | ○ | x | ○ |
| Comparative Example 11 | DMAc | 35.70 | DEG | 30.00 | 29.50 | ○ | △ | ○ | x |
| Comparative Example 12 | DMAc | 34.20 | DEG | 30.00 | 29.50 | ○ | △ | ○ | x |
| Comparative Example 13 | DMAc | 36.75 | DMSO | 30.00 | 29.70 | x | △ | ○ | ○ |
| Comparative Example 14 | DMAc | 42.26 | DEG | 34.49 | 18.00 | △ | △ | ○ | ○ |
| Comparative Example 15 | DMAc | 31.24 | DEG | 25.51 | 38.00 | ○ | ○ | x | x |
| Comparative Example 16 | DMAc | 39.55 | DEG | 30.00 | 30.00 | △ | △ | ○ | x |
| Comparative Example 17 | DMAc | 39.05 | DEG | 30.00 | 30.00 | △ | △ | ○ | x |
| Comparative Example 18 | DMAc | 38.55 | DEG | 30.00 | 30.00 | △ | △ | ○ | x |

TABLE 1-continued

| | | | | | | | | | |
|---|---|---|---|---|---|---|---|---|---|
| Comparative Example 19 | DMAc | 37.55 | DEG | 30.00 | 30.00 | Δ | Δ | ○ | x |
| Comparative Example 20 | DMAc | 36.55 | DEG | 30.00 | 30.00 | Δ | Δ | ○ | x |
| Comparative Example 21 | DMAc | 37.00 | DEG | 30.00 | 30.00 | x | ○ | x | x |
| Comparative Example 22 | DMAc | 35.70 | DEG | 30.00 | 30.00 | Δ | ○ | ○ | x |
| Comparative Example 23 | DMAc | 34.00 | DEG | 30.00 | 30.00 | Δ | Δ | ○ | x |
| Comparative Example 24 | DMAc | 38.00 | DEG | 30.00 | 30.00 | x | x | ○ | ○ |
| Comparative Example 25 | DMAc | 37.94 | DEG | 30.00 | 30.00 | ○ | ○ | x | ○ |
| Comparative Example 26 | DMAc | 35.70 | DEG | 30.00 | 30.00 | ○ | Δ | ○ | x |
| Comparative Example 27 | DMAc | 34.20 | DEG | 30.00 | 30.00 | ○ | Δ | ○ | x |
| Comparative Example 28 | DMAc | 36.75 | DMSO | 30.00 | 30.00 | x | Δ | ○ | ○ |
| Comparative Example 29 | DMAc | 42.26 | DEG | 34.49 | 20.00 | Δ | Δ | ○ | ○ |
| Comparative Example 30 | DMAc | 31.24 | DEG | 25.51 | 40.00 | ○ | ○ | x | x |
| Comparative Example 31 | DEG | 20.00 | MFG | 51.00 | 26.00 | ○ | ○ | ○ | x |
| Comparative Example 32 | DEG | 20.00 | MFG | 51.00 | 25.00 | ○ | ○ | ○ | x |
| Comparative Example 33 | DEG | 20.00 | MFG | 51.00 | 25.00 | ○ | ○ | ○ | x |
| Comparative Example 34 | DGME | 30.00 | — | — | 68.00 | ○ | ○ | x | x |
| Comparative Example 35 | — | — | — | — | 99.88 | x | x | ○ | x |
| Comparative Example 36 | DMF | 69.00 | — | — | 29.70 | x | x | ○ | ○ |
| Comparative Example 37 | EG | 99.00 | — | — | — | x | x | ○ | ○ |
| Comparative Example 38 | PGE | 80.00 | — | — | 10.00 | x | x | ○ | ○ |
| Comparative Example 39 | 1,3-BDO | 95.00 | — | — | 0.03 | x | x | ○ | ○ |

*1 Molar ratio of methanesulfonic acid/ammonium fluoride (or methanesulfonic acid/fluorine compound in Comparative Examples with no ammonium fluoride).

Abbreviations

DMAc: N,N-dimethylacetamide, DEG: diethylene glycol, DPG: dipropylene glycol, TEG: tetraethylene glycol, DGME: diethylene glycol monomethyl ether, MFDG: dipropylene glycol monomethyl ether, MFG: propylene glycol monomethyl ether,
DGBE: diethylene glycol monobutyl ether, DMSO: dimethylsulfoxide, HEDP: 1-hydroxyethylidene-1,1-disulfonic acid
EG: 1,2-ethanediol, PGE: 1-ethoxy-2-propanol, 1,3-BDO: 1,3-butanediol Examples 26 to 37, Comparative Examples 40 to 51

According to the formulation (% by mass) shown in Table 2, residue removing liquid compositions of Examples 26 to 37 and Comparative Examples 40 to 51 were prepared. Except the carbon-carbon tripe bond-having compound (anticorrosive) the basic formulation of these residue removing liquid compositions was the same as that of the composition of Example 14. The composition of Comparative Example 40 does not contain the anticorrosive; and the compositions of Comparative Examples 41 to 51 contain an additive except the carbon-carbon tripe bond-having compound as in the present invention, in an amount of 0.50% by mass added thereto. The reagents used here are all special grade chemical reagents.

Aqueous dilutions of the obtained residue removing liquid compositions (prepared by mixing 10 g of the residue removing liquid composition of Examples or Comparative Examples and 10 g of ultrapure water) were evaluated for the corrosiveness to Al—Cu. A silicon wafer section coated with an Al—Cu film (containing 0.5% by mass of Cu) on the entire surface thereof was dipped in the residue removing liquid composition, and before and after dipping, the film thickness was analyzed with a fluorescent X-ray analyzer to determine the etching rate. The fluorescent X-ray analyzer used here is SII Nanotechnology's SEA2110L. The data of the etching rate are shown in Table 2.

The aqueous dilutions of the residue removing liquid compositions containing the anticorrosive of Examples 26 to 37 had an Al—Cu etching rate of at most 80% of that of the composition of Comparative Example 40 with no anticorrosive; and the corrosiveness of the former obviously lowered. The aqueous dilutions of the residue removing liquid compositions of Comparative Examples 41 to 45 containing the anticorrosive added thereto had an Al—Cu etching rate of from 85% to 100% of that of the composition of Comparative Example 40 with no anticorrosive; from which it is confirmed that the former do not have any obvious etching rate-reducing effect. The aqueous dilutions of the residue removing liquid compositions of Comparative Examples 46 to 51 containing the anticorrosive added thereto had an Al—Cu etching rate of more than 100% of that of the composition of Comparative Example 40 with no anticorrosive, or that is, the former increased the etching rate.

TABLE 2

| | Formulation of Removing Liquid Composition (% by mass) | | | | | | |
|---|---|---|---|---|---|---|---|
| | Ammonium Fluoride (Fluorine Compound) | | Methanesulfonic Acid (Acid) | | Molar Ratio *1 | Carbon-Carbon Tripe Bond-Having Compound (Anticorrosive) | |
| Example 26 | ammonium fluoride | 1.00 | methanesulfonic acid | 3.00 | 1.16 | 3-methyl-pentyn-3-ol | 0.50 |
| Example 27 | ammonium fluoride | 1.00 | methanesulfonic acid | 3.00 | 1.16 | 1-Ethynyl-1-cyclohexanol | 0.50 |
| Example 28 | ammonium fluoride | 1.00 | methanesulfonic acid | 3.00 | 1.16 | 2-Propyn-1-ol | 0.50 |
| Example 29 | ammonium fluoride | 1.00 | methanesulfonic acid | 3.00 | 1.16 | 2-Butyne-1,4-diol | 0.50 |
| Example 30 | ammonium fluoride | 1.00 | methanesulfonic acid | 3.00 | 1.16 | 4-Ethyl-1-octyn-3-ol | 0.50 |
| Example 31 | ammonium fluoride | 1.00 | methanesulfonic acid | 3.00 | 1.16 | 3-Methyl-1-butyn-3-ol | 0.50 |
| Example 32 | ammonium fluoride | 1.00 | methanesulfonic acid | 3.00 | 1.16 | 1-Octyn-3-ol | 0.50 |
| Example 33 | ammonium fluoride | 1.00 | methanesulfonic acid | 3.00 | 1.16 | Ethynylbenzene | 0.50 |
| Example 34 | ammonium fluoride | 1.00 | methanesulfonic acid | 3.00 | 1.16 | 3,3-Dimethyl-1-butyne | 0.50 |
| Example 35 | ammonium fluoride | 1.00 | methanesulfonic acid | 3.00 | 1.16 | 2-Butyn-1-ol | 0.50 |
| Example 36 | ammonium fluoride | 1.00 | methanesulfonic acid | 3.00 | 1.16 | 3,5-Dimethyl-1-hexyn-3-ol | 0.50 |

TABLE 2-continued

| | | | | | | | |
|---|---|---|---|---|---|---|---|
| Example 37 | ammonium fluoride | 1.00 | methanesulfonic acid | 3.00 | 1.16 | 3-Hexyne-2,5-diol | 0.50 |
| Comparative Example 40 | hydrofluoric acid | 1.00 | methanesulfonic acid | 3.00 | 1.16 | — | 0.50 |
| Comparative Example 41 | hydrofluoric acid | 1.00 | methanesulfonic acid | 3.00 | 1.16 | Acetic Acid | 0.50 |
| Comparative Example 42 | hydrofluoric acid | 1.00 | methanesulfonic acid | 3.00 | 1.16 | 2,4,7,9-Tetra-methyl-5-decyne-4,7-diol | 0.50 |
| Comparative Example 43 | hydrofluoric acid | 1.00 | methanesulfonic acid | 3.00 | 1.16 | 2,5-Dimethyl-3-hexyne-2,5-diol | 0.50 |
| Comparative Example 44 | hydrofluoric acid | 1.00 | methanesulfonic acid | 3.00 | 1.16 | Trehalose Dihydrate | 0.50 |
| Comparative Example 45 | tetramethylammonium fluoride | 1.00 | methanesulfonic acid | 3.00 | 1.16 | 3,6-Dimethyl-4-octyne-3,6-diol | 0.50 |
| Comparative Example 46 | tetramethylammonium fluoride | 1.00 | methanesulfonic acid | 3.00 | 1.16 | Tartaric Acid | 0.50 |
| Comparative Example 47 | tetramethylammonium fluoride | 1.00 | methanesulfonic acid | 3.00 | 1.16 | 20% Hydrochloric Acid | 0.50 |
| Comparative Example 48 | — | 1.00 | methanesulfonic acid | 3.00 | 1.16 | Xylitol | 0.50 |
| Comparative Example 49 | ammonium fluoride | 1.00 | methanesulfonic acid | 3.00 | 1.16 | Catechol | 0.50 |
| Comparative Example 50 | ammonium fluoride | 1.00 | methanesulfonic acid | 3.00 | 1.16 | Benzyl Alcohol | 0.50 |
| Comparative Example 51 | ammonium fluoride | 1.00 | methanesulfonic acid | 3.00 | 1.16 | Oxalic Acid | 0.50 |

| | Formulation of Removing Liquid Composition (% by mass) | | | | Al—Cu Etching Rate with Aqueous Dilutions *2 |
|---|---|---|---|---|---|
| | Water-Soluble Organic Solvent | | | Water | |
| Example 26 | DEG | 30.00 | MFG | 35.00 | 30.50 | 240 |
| Example 27 | DEG | 30.00 | MFG | 35.00 | 30.50 | 300 |
| Example 28 | DEG | 30.00 | MFG | 35.00 | 30.50 | 310 |
| Example 29 | DEG | 30.00 | MFG | 35.00 | 30.50 | 330 |
| Example 30 | DEG | 30.00 | MFG | 35.00 | 30.50 | 330 |
| Example 31 | DEG | 30.00 | MFG | 35.00 | 30.50 | 330 |
| Example 32 | DEG | 30.00 | MFG | 35.00 | 30.50 | 340 |
| Example 33 | DEG | 30.00 | MFG | 35.00 | 30.50 | 340 |
| Example 34 | DEG | 30.00 | MFG | 35.00 | 30.50 | 350 |
| Example 35 | DEG | 30.00 | MFG | 35.00 | 30.50 | 360 |
| Example 36 | DEG | 30.00 | MFG | 35.00 | 30.50 | 400 |
| Example 37 | DEG | 30.00 | MFG | 35.00 | 30.50 | 410 |
| Comparative Example 40 | DEG | 30.00 | MFG | 35.00 | 30.50 | 520 |
| Comparative Example 41 | DEG | 30.00 | MFG | 35.00 | 30.50 | 450 |
| Comparative Example 42 | DEG | 30.00 | MFG | 35.00 | 30.50 | 460 |
| Comparative Example 43 | DEG | 30.00 | MFG | 35.00 | 30.50 | 480 |
| Comparative Example 44 | DEG | 30.00 | MFG | 35.00 | 30.50 | 520 |
| Comparative Example 45 | DEG | 30.00 | MFG | 35.00 | 30.50 | 520 |
| Comparative Example 46 | DEG | 30.00 | MFG | 35.00 | 30.50 | 540 |
| Comparative Example 47 | DEG | 30.00 | MFG | 35.00 | 30.50 | 540 |
| Comparative Example 48 | DEG | 30.00 | MFG | 35.00 | 30.50 | 550 |
| Comparative Example 49 | DEG | 30.00 | MFG | 35.00 | 30.50 | 550 |
| Comparative Example 50 | DEG | 30.00 | MFG | 35.00 | 30.50 | 560 |
| Comparative Example 51 | DEG | 30.00 | MFG | 35.00 | 30.50 | 610 |

*1 Molar ratio of methanesulfonic acid/ammonium fluoride.
*2 Aqueous dilution, prepared by mixing 10 g of the residue removing liquid composition of Examples and Comparative Examples and 10 g of ultrapure water.

Abbreviations

DEG: diethylene glycol, MFG: propylene glycol monomethyl ether

INDUSTRIAL APPLICABILITY

Using the residue removing liquid composition and the cleaning method of the present invention, the resist residue and the Ti-derived residue remaining after dry etching and ashing for via hole formation in a production process for a semiconductor substrate having metal wiring of Al or an Al alloy containing at least 90% by mass of Al can be completely removed at a low temperature in a short time, and not corroding the parts of an interlayer insulating material, a wiring material and others, the product yield can be increased in production of semiconductor devices.

The invention claimed is:
1. A cleaning method for removing at least one residue remaining in an electronic material substrate, comprising:
applying a first resist on the substrate to form a first resist layer thereon;
exposing the substrate comprising the first resist layer to light to obtain a first developed substrate;
dry-etching the first developed substrate via the first resist layer serving as a mask to form an Al alloy wiring pattern;
removing the first resist layer by ashing with plasma gas;
removing a residue of the first resist by chemical treatment;
laminating thereon an interlayer insulating film layer of SiOx lo obtain a laminated substrate; thereafter
applying a second resist on the laminated substrate to form a second resist layer thereon;
exposing the laminated substrate comprising the second resist layer to light to obtain a second developed laminated substrate:
dry-etching the second developed laminated substrate via the second resist layer serving as a mask to form a via hole in the interlayer insulating film layer and a barrier metal layer on the Al alloy wiring pattern; and
removing the second resist layer by ashing with plasma gas,
wherein a residue removing liquid composition is employed for removing the residue in at least the via hole, and
the substrate is produced by laminating
SiOx,
a first barrier metal layer of TiN/Ti,
an Al alloy layer of Al-Cu,

Al—Si or Al—Si—Cu comprising at least 90% by mass of Al, and
a second barrier metal layer of TiN/Ti
in that order on a silicon substrate;
wherein the residue removing liquid composition comprises:
(A) ammonium fluoride;
(B) methanesulfonic acid;
(C) a compound comprising at least one carbon-carbon triple bond selected from the group consisting of
3-methyl-1-pentyn-3-ol,
1-ethynyl-1-cyclohexanol,
2-propyn-1-ol,
2-butyne-1,4-diol,
4-ethyl-1-oclyn-3-ol,
3-methyl-1-butyn-3-ol,
1-octyn-3-ol,
ethynylbenzene,
3,3-dimethyl-1-butyne,
2-butyn-1-ol,
3,5-dimethyl-l-hexyn-3-ol, and
3-hexyne-2,5-diol;
(D) at least one water-soluble organic solvent selected from the group consisting of polyalcohols. glycol ethers, and amides; and
(E) water,
wherein the content of (A), (C), (D) and (E) in the residue removing liquid composition from 0.005 to 2% by mass, from 0.1 to 10% by mass, from 60 to 75% by mass and from 5 to 38% by mass, respectively, and (B) is comprised in an amount of from 0.9 to 1.5 times, by mol of the amount of (A).

2. The cleaning method according to claim 1, wherein the residue is removed at 10 to 40° C.

3. The cleaning method according to claim 2, wherein the residue is removed within 30 seconds to 3 minutes.

4. The cleaning method according to claim 1, wherein the residue is removed within 30 seconds to 3 minutes.

5. A cleaning method for removing at least one titanium-containing residue from an electronic material substrate produced by laminating SiOx, a first barrier metal layer of TiN/Ti, an Al alloy layer of Al—Cu, Al—Si or Al—Si—Cu containing at least 90% by mass of Al, and a second barrier metal layer of TiN/Ti in that order on a silicon substrate, comprising:
applying a first resist on the second barrier metal layer of TiN/Ti of the substrate to form a first resist layer on the substrate;
exposing the first resist layer to light to obtain a first developed substrate;
dry-etching the first developed substrate with the first resist layer serving as a mask to form an Al alloy wiring pattern;
removing the first resist layer from the substrate by ashing with plasma gas to form an ashed substrate having an ash residue present thereon;
removing the ash residue by chemical treatment to form a cleaned and developed first resist layer;
laminating an interlayer insulating film layer of SiOx on the cleaned and developed first resist layer to obtain a laminated substrate; then
applying a second resist on the laminated substrate to form a substrate having a second resist layer;
exposing the second resist layer to light to obtain a second developed laminated substrate;
dry-etching the second developed laminated substrate with the second resist layer serving as a mask to form a via hole in the interlayer insulating film layer and a outer barrier metal layer on the Al alloy wiring pattern; and
removing the second resist layer by ashing with plasma gas to form the via hole wherein the via hole contains one or more titanium-containing residues, and
removing the titanium-containing residue from the via hole by contacting the via hole with a residue-removing liquid composition comprising:
(A) ammonium fluoride;
(B) methanesulfonic acid;
(C) a compound comprising at least one carbon-carbon triple bond selected from the group consisting of 3-methyl-1-pentyn-3-ol, 1-ethynyl-1-cyclohexanol, 2-propyn-1-ol, 2-butyne-1,4-diol, 4-ethyl-1-octyn-3-ol, 3-methyl-1-butyn-3-ol, 1-octyn-3-ol, ethynylbenzene, 3,3-dimethyl-1-butyne, 2-butyn-1-ol, 3,5-dimethyl-1-hexyn-3-ol, and 3-hexyne-2,5-diol;
(D) at least one water-soluble organic solvent selected from the group consisting of a polyalcohol, a glycol ether, and an amide; and
(E) water;
wherein the residue-removing liquid composition the content of (A) is from 0.005 to 2% by mass, the content of (C) is from 0.1 to 10% by mass, the content of (D) is from 60 to 75% by mass and the content of (E) is from 5 to 38% by mass based on the total mass of the residue-removing liquid composition, and (B) is present in an amount of from 0.9 to 1.5 times by mol of the amount of (A).

6. The cleaning method according to claim 1, wherein the titanium-containing residue is removed at 10 to 40° C.

7. The cleaning method according to claim 1, wherein the titanium-containing residue is removed within 30 seconds to 3 minutes.

8. The cleaning method according to claim 1, wherein (A) is present in the residue-removing liquid composition in an amount of from 0.01 to 1.8% by mass.

9. The cleaning method according to claim 1, wherein (A) is present in the residue-removing liquid composition in an amount of from 0.1 to 1.5% by mass.

10. The cleaning method according to claim 1, wherein (C) is present in the residue-removing liquid composition in an amount of from is 0.15 to 8% by mass.

11. The cleaning method according to claim 1, wherein (C) is present in the residue-removing liquid composition in an amount of from 0.2 to 5% by mass.

12. The cleaning method according to claim 1, wherein (E) is present in the residue-removing liquid composition in an amount of from 20 to 38% by mass.

13. The cleaning method according to claim 5, wherein (E) is present in the residue-removing liquid composition in an amount of from 20 to 31% by mass.

* * * * *